US012712041B2

(12) United States Patent
Xu et al.

(10) Patent No.: US 12,712,041 B2
(45) **Date of Patent: *Aug. 18, 2026**

(54) DEFECT DETECTION DURING ERASE OPERATIONS

(71) Applicant: Micron Technology, Inc., Boise, ID (US)

(72) Inventors: Jun Xu, San Jose, CA (US); Kitae Park, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 135 days.

This patent is subject to a terminal disclaimer.

(21) Appl. No.: 18/800,670

(22) Filed: Aug. 12, 2024

(65) Prior Publication Data

US 2024/0404615 A1 Dec. 5, 2024

Related U.S. Application Data

(63) Continuation of application No. 17/889,578, filed on Aug. 17, 2022, now Pat. No. 12,094,549.

(Continued)

(51) Int. Cl.
*G11C 29/12* (2006.01)
*G11C 16/10* (2006.01)

(Continued)

(52) U.S. Cl.
CPC .............. *G11C 29/12* (2013.01); *G11C 16/10* (2013.01); *G11C 16/14* (2013.01);

(Continued)

(58) Field of Classification Search
CPC . G11C 29/12; G11C 29/021; G11C 29/12005; G11C 29/025; G11C 29/20;

(Continued)

(56) References Cited

U.S. PATENT DOCUMENTS 5,487,036 A 1/1996 Akaogi et al.
5,644,530 A 7/1997 Gaultier (Continued)

FOREIGN PATENT DOCUMENTS

CN 107045889 A 8/2017
CN 109767805 A 5/2019

(Continued)

OTHER PUBLICATIONS

Office Action for Chinese Patent Application No. 202211062935.3, mailed Jul. 16, 2025, 26 Pages.

*Primary Examiner* — Sultana Begum
(74) *Attorney, Agent, or Firm* — Lowenstein Sandler LLP

(57) ABSTRACT

A system includes a memory device including a memory array and processing logic, operatively coupled with the memory array, to perform operations including initiating an erase operation performed with respect to the memory array, identifying, between a pair of components of the memory array, at least one current differential indicative of at least one defect with respect to at least one failure point of the memory array, and causing an indication of the at least one defect to be generated. The erase operation includes a select gate scan sub-operation.

20 Claims, 8 Drawing Sheets

Related U.S. Application Data

(60) Provisional application No. 63/239,534, filed on Sep. 1, 2021.

(51) Int. Cl.
*G11C 16/14* (2006.01)
*G11C 16/34* (2006.01)

(52) U.S. Cl.
CPC .. *G11C 16/3445* (2013.01); *G11C 2029/1202* (2013.01); *G11C 2029/1204* (2013.01)

(58) Field of Classification Search
CPC ..... G11C 29/4401; G11C 16/10; G11C 16/14; G11C 16/3445; G11C 16/16; G11C 16/0483; G11C 2029/1202; G11C 2029/1204; G11C 11/5635
See application file for complete search history.

(56) References Cited

U.S. PATENT DOCUMENTS

| | | | |
|---|---|---|---|
| 5,724,365 | A | 3/1998 | Hsia et al. |
| 12,094,549 | B2 * | 9/2024 | Xu ..................... G11C 29/4401 |
| 2005/0002258 | A1 | 1/2005 | Iwase et al. |
| 2005/0265081 | A1 | 12/2005 | Tran et al. |
| 2011/0013446 | A1 | 1/2011 | Lung |
| 2015/0179275 | A1 | 6/2015 | Patel et al. |
| 2015/0293824 | A1 | 10/2015 | Peters |
| 2019/0006021 | A1 | 1/2019 | Ghai et al. |

FOREIGN PATENT DOCUMENTS

| | | | |
|---|---|---|---|
| CN | 110322918 | A | 10/2019 |
| CN | 112466373 | A | 3/2021 |
| EP | 2626903 | A1 | 8/2013 |
| JP | 2008293555 | A | 12/2008 |

* cited by examiner

300
Perform an erase operation
310
Perform an erase operation screen
320

400
START
Perform pre-programming sub-operation
410
Perform erase pulse sub-operation
420
Perform anneal pulse sub-operation
430
Perform erase verify sub-operation
440
Erase verify sub-operation successful?
450
N
Y
Perform SG scan sub-operation
460
END

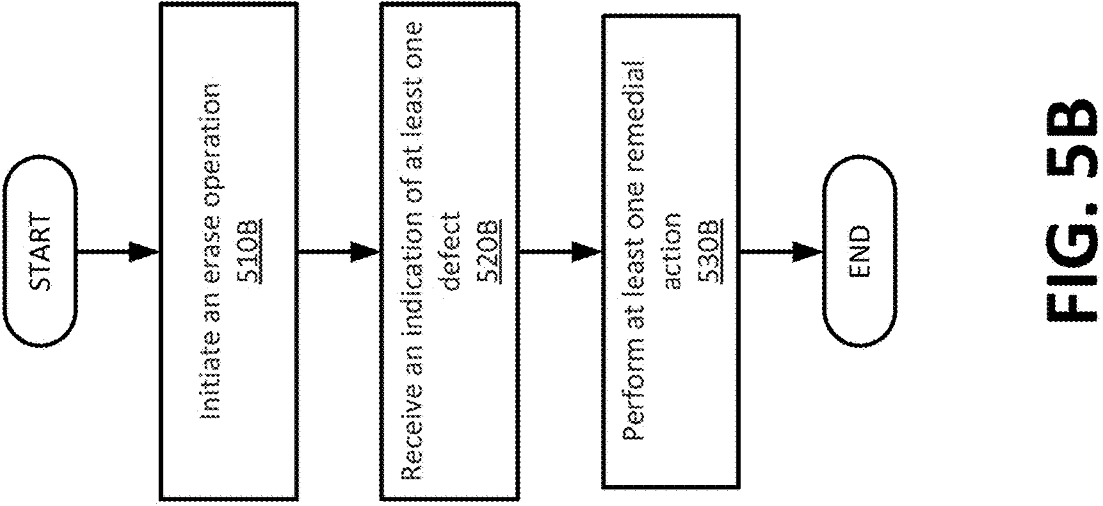
FIG. 5B

DEFECT DETECTION DURING ERASE OPERATIONS

CROSS-REFERENCE TO RELATED APPLICATIONS

The present application is a continuation of U.S. patent application Ser. No. 17/889,578, filed on Aug. 17, 2022, which claims the benefit of U.S. Provisional Application 63/239,534, filed on Sep. 1, 2021, the entire contents of which are hereby incorporated by reference herein.

TECHNICAL FIELD

Embodiments of the disclosure relate generally to memory sub-systems, and more specifically, relate to defect detection during erase operations.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIGS. 5A-5B are flow diagram of example methods to perform defect detection during at least one sub-operation of an erase operation, in accordance with some embodiments of the present disclosure.

DETAILED DESCRIPTION

Figure 1:
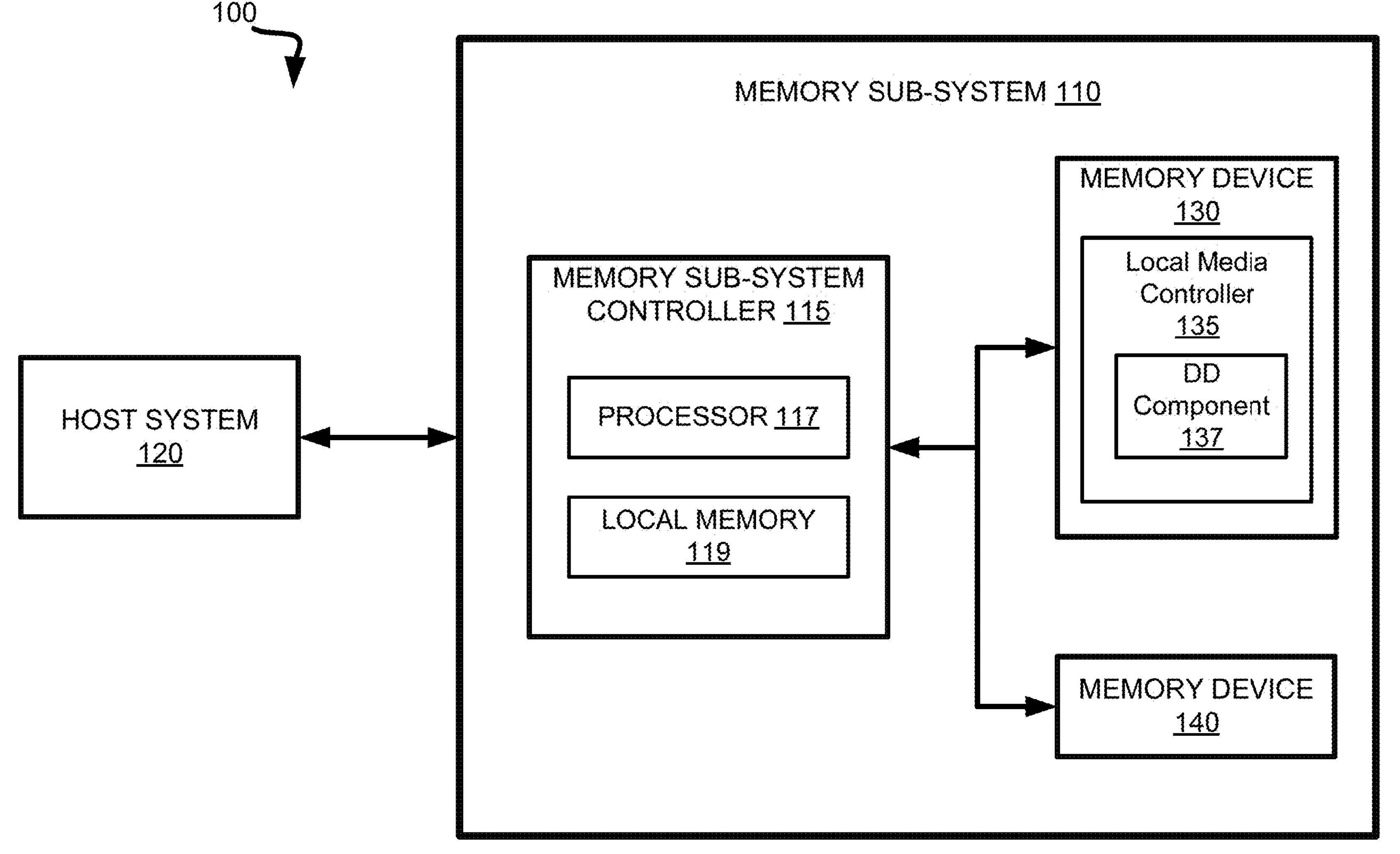
FIG. 1 illustrates an example computing system that includes a memory sub-system in accordance with some embodiments of the present disclosure.

Aspects of the present disclosure are directed to defect detection during erase operations. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells. A memory cell is an electronic circuit that stores information. Depending on the memory cell type, a memory cell can store one or more bits of binary information, and has various logic states that correlate to the number of bits being stored. The logic states can be represented by binary values, such as "0" and "1", or combinations of such values.

A memory device can include multiple memory cells arranged in a two-dimensional or three-dimensional grid. The memory cells are formed onto a silicon wafer in an array of columns (also hereinafter referred to as bitlines) and rows (also hereinafter referred to as wordlines). A wordline can refer to one or more conductive lines of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types. For ease of description, these circuits can be generally referred to as independent plane driver circuits. Control logic on the memory device includes a number of separate processing threads to perform concurrent memory access operations (e.g., read operations, program operations, and erase operations). For example, each processing thread corresponds to a respective one of the memory planes and utilizes the associated independent plane driver circuits to perform the memory access operations on the respective memory plane. As these processing threads operate independently, the power usage and requirements associated with each processing thread also varies.

A three-dimensional (3D) replacement gate memory device (e.g., 3D replacement gate NAND) is a memory device with a replacement gate structure using wordline stacking. For example, a 3D replacement gate memory device can include wordlines, select gates, etc. sandwiched between sets of layers including a pillar (e.g., polysilicon pillar), a tunnel oxide layer, a charge trap (CT) layer, and a dielectric (e.g. oxide) layer. A 3D replacement gate memory device can have a "top deck" corresponding to a first side and a "bottom deck" corresponding to a second side. For example, the first side can be a drain side and the second side can be a source side. Data in a 3D replacement gate memory device can be stored as 1 bit/memory cell (SLC), 2 bits/memory cell (MLC), 3 bits/memory cell (TLC), etc. Read window budget (RWB) margin corresponding to the distance between valleys of a threshold voltage distribution can decrease as the number of bits/memory cell increases.

An erase operation for a memory device, such as a block erase operation for a NAND memory device, can be performed by performing a number of sub-operations. The sub-operations can include an erase pulse sub-operation during which an erase pulse voltage is applied to erase memory cells, and an erase verify sub-operation during which an erase verify voltage is applied to verify the results of the erase pulse. Instead of utilizing a single high voltage erase pulse, which can lead to increased memory device wear and reduced memory device endurance, the erase operation can be performed using multiple erase pulses (e.g., at most 5 erase pulses) that are applied with progressively higher voltages, and an erase verify being performed after each of the multiple erase pulses to identify those memory cells that have been erased or not erased by the previous erase pulse. That is, if any memory cells have not been verified as being erased after an erase pulse, a higher erase pulse voltage is applied those memory cells during the next erase pulse. An erase pulse sub-operation can include a ramping stage in which the erase pulse is ramped up to a designated erase pulse voltage, an execution stage upon the erase pulse being ramped up to the designated voltage, and a reset stage in which the voltage is reset in order to perform the subsequent erase verify sub-operation. Each of these erase pulse/erase verify cycles can be referred to as an erase loop. A memory device can return an indication that the erase operation failed if a number of erase loops that have been performed does not satisfy a threshold condition. For example, the memory device can return an indication that the erase operation failed if the number of erase loops exceeds a threshold number of erase loops.

In certain memory devices, such as 3D replacement gate memory devices (e.g., 3D replacement gate NAND devices), a die can provide its status through at least one register (e.g., 8-bit register). More specifically, the at least one status register can include a status register and an extended status register. Regarding erase operation status, the status register can include a bit to indicate whether an erase operation has passed or failed. That is, when set to one particular state, the bit can indicate that an error occurred during the erase operation. However, for a multi-plane device including a number of planes, the bit may not indicate which plane has failed. To address this, a command (e.g. 78 h command) can be sent to each plane to determine which of the planes has failed.

It may be the case that the memory device can include one or more defects. Examples of defects can include shorts (e.g., wordline shorts, bitline shorts). A defect can result in failure during a memory device operation, such as an erase operation, a program operation or a read operation. However, some defects may be undetectable at the time of manufacturer, or the defects may develop over time during the operating life of the memory device. Moreover, some early-stage defects may not be detected during certain erase operation (e.g., during erase verify), but can lead to failure during the following program operation or read operation. Accordingly, erase operations performed on defective memory devices may not result in erase failure.

Aspects of the present disclosure address the above and other deficiencies by implementing defect detection during erase operations (e.g., block erase operations). The defect detection can leverage the voltages used to perform erase operations to identify the existence of defects. For example, one or more current leak detection mechanisms can be used to determine whether a current leak and/or voltage drop resulting from the current leak exists between one or more pairs of components of the memory device during the one or more sub-operations, and the existence of a the current leak and/or voltage drop provides an indication of a defect within the memory device. A current leak may or may not cause a voltage drop, depending on a size of the leak current and strength of the driving voltage. Since erase operations are generally slow as compared to other memory device operations, erase operations are not speed sensitive.

For example, an erase operation can include a number of sub-operations. The sub-operations can include an erase pulse sub-operation and an erase verify sub-operation. In some embodiments, the sub-operations can further include a pre-programming sub-operation performed prior to the erase pulse sub-operation. In some embodiments, the sub-operation can further include an anneal pulse sub-operation performed in between the erase pulse sub-operation and the erase verify sub-operation. In some embodiments, the sub-operations can further include a select gate (SG) scan sub-operation. Defect detection can be performed during one or more of the sub-operations. For example, defect detection can be performed during the erase pulse sub-operation and/or the erase verify sub-operation. Additionally or alternatively, defect detection can be performed during the pre-programming sub-operation, the anneal pulse sub-operation, and/or the SG scan sub-operation.

The defect detection described herein can be implemented within the context of 3D replacement gate memory devices (e.g., 3D replacement gate NAND). For example, defect detection be performed by identifying a WL to pillar current leak, which can correspond to a device defect (e.g., an open between the WL and the pillar). As another example, defect detection can be performed by identifying a high difference or delta in voltage between an even WL and an odd WL, which can correspond to a device defect (e.g., a short between the even WL and the odd WL).

Advantages of the present disclosure include, but are not limited to, improved memory device defect detection, and improved memory device reliability.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Pillar, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level memory cells (SLC) can store one bit per memory cell. Other types of memory cells, such as multi-level memory cells (MLCs), triple level memory cells (TLCs), quad-level memory cells (QLCs), and penta-level memory cells (PLCs) can store multiple bits per memory cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The local media controller 135 can implement a defect detection (DD) component 137 that can perform defect detection during an erase operation. For example, the DD component 137 can perform defect detection during one or more of a pre-programming sub-operation, an erase pulse sub-operation, an anneal pulse sub-operation, an erase verify sub-operation, and a select gate (SG) scan sub-operation. In some embodiments, the DD component 137 performs defect detection during the erase pulse and the erase verify sub-operations. The defect detection can be performed with respect to any suitable failure point using any suitable detection method. Further details regarding the operations of the DD component 137 will be described below with reference to FIGS. 3-5.

Figure 2:
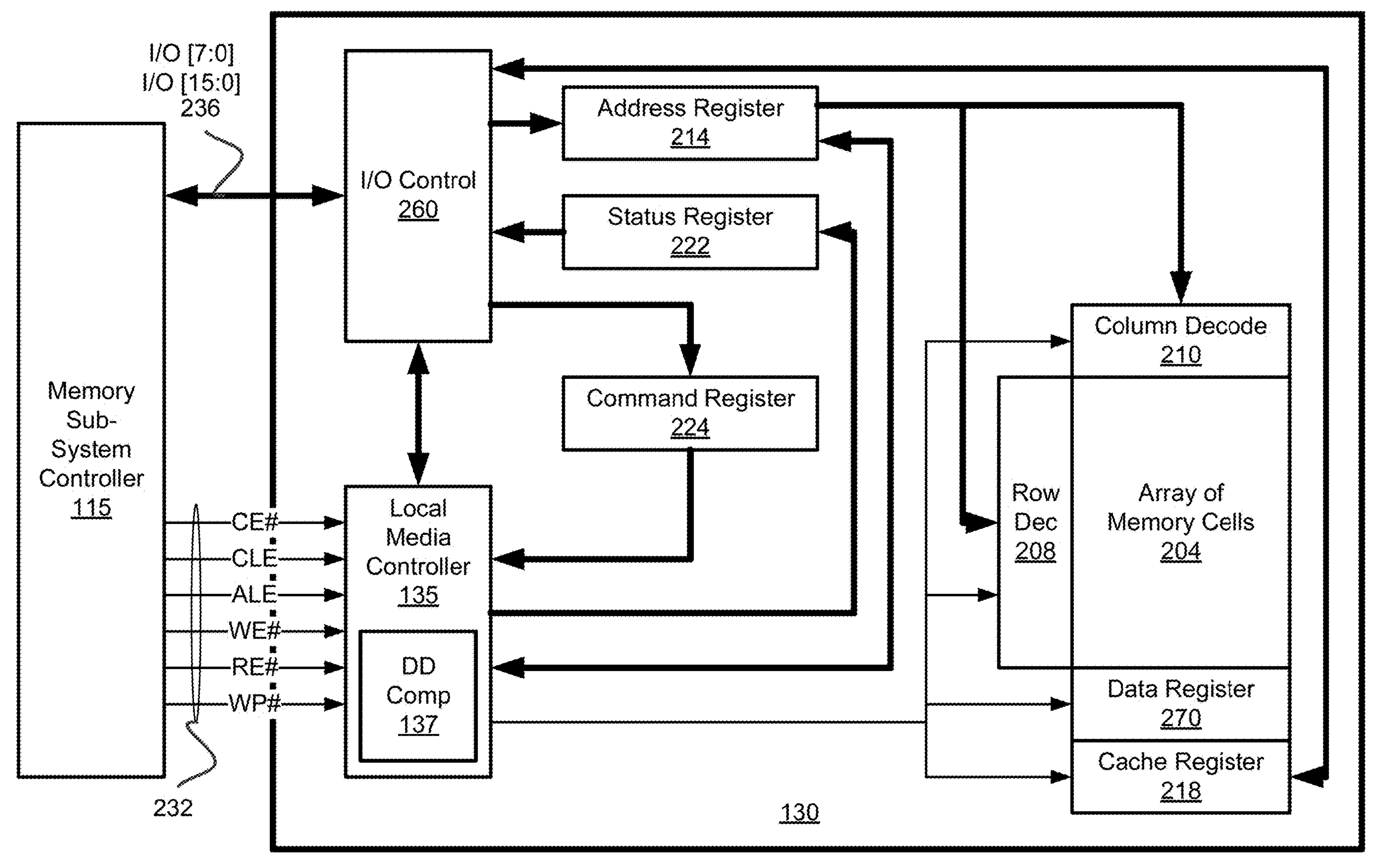
FIG. 2 is a block diagram of a memory device in communication with a memory sub-system controller of a memory sub-system in accordance with some embodiments of the present disclosure.

FIG. 2 is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 204 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 2) of at least a portion of array of memory cells 204 are capable of being programmed to one of at least two target data states.

Row decode circuitry 208 and column decode circuitry 210 are provided to decode address signals. Address signals are received and decoded to access the array of memory cells 204. Memory device 130 also includes input/output (I/O) control circuitry 260 to manage input of commands, addresses and data to the memory device 130 as well as output of data and status information from the memory device 130. An address register 214 is in communication with I/O control circuitry 260 and row decode circuitry 208 and column decode circuitry 210 to latch the address signals prior to decoding. A command register 224 is in communication with I/O control circuitry 260 and local media controller 135 to latch incoming commands.

A controller (e.g., the local media controller 135 internal to the memory device 130) controls access to the array of memory cells 204 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 208 and column decode circuitry 210 to control the row decode circuitry 208 and column decode circuitry 210 in response to the addresses. In one embodiment, local media controller 135 includes the DD component 137, which can implement the defect detection described herein during an erase operation on memory device 130.

The local media controller 135 is also in communication with a cache register 218. Cache register 218 latches data, either incoming or outgoing, as directed by the local media controller 135 to temporarily store data while the array of memory cells 204 is busy writing or reading, respectively, other data. During a program operation (e.g., write operation), data may be passed from the cache register 218 to the data register 270 for transfer to the array of memory cells 204; then new data may be latched in the cache register 218 from the I/O control circuitry 260. During a read operation, data may be passed from the cache register 218 to the I/O control circuitry 260 for output to the memory sub-system controller 115; then new data may be passed from the data register 270 to the cache register 218. The cache register 218 and/or the data register 270 may form (e.g., may form a portion of) a page buffer of the memory device 130. A page buffer may further include sensing devices (not shown in FIG. 2) to sense a data state of a memory cell of the array of memory cells 204, e.g., by sensing a state of a data line connected to that memory cell. A status register 222 may be in communication with I/O control circuitry 260 and the local memory controller 135 to latch the status information for output to the memory sub-system controller 115.

Memory device 130 receives control signals at the memory sub-system controller 115 from the local media controller 135 over a control link 232. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 232 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 236 and outputs data to the memory sub-system controller 115 over I/O bus 236.

For F example, the commands may be received over input/output (I/O) pins [7:0] of I/O bus 236 at I/O control circuitry 260 and may then be written into command register 224. The addresses may be received over input/output (I/O) pins [7:0] of I/O bus 236 at I/O control circuitry 260 and may then be written into address register 214. The data may be received over input/output (I/O) pins [7:0] for an 8-bit device or input/output (I/O) pins [15:0] for a 16-bit device at I/O control circuitry 260 and then may be written into cache register 218. The data may be subsequently written into data register 270 for programming the array of memory cells 204.

In an embodiment, cache register 218 may be omitted, and the data may be written directly into data register 270. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2. Additionally, while specific I/O pins are described in accordance with popular conventions for receipt and output of the various signals, it is noted that other combinations or numbers of I/O pins (or other I/O node structures) may be used in the various embodiments.

Figures 3, 4:
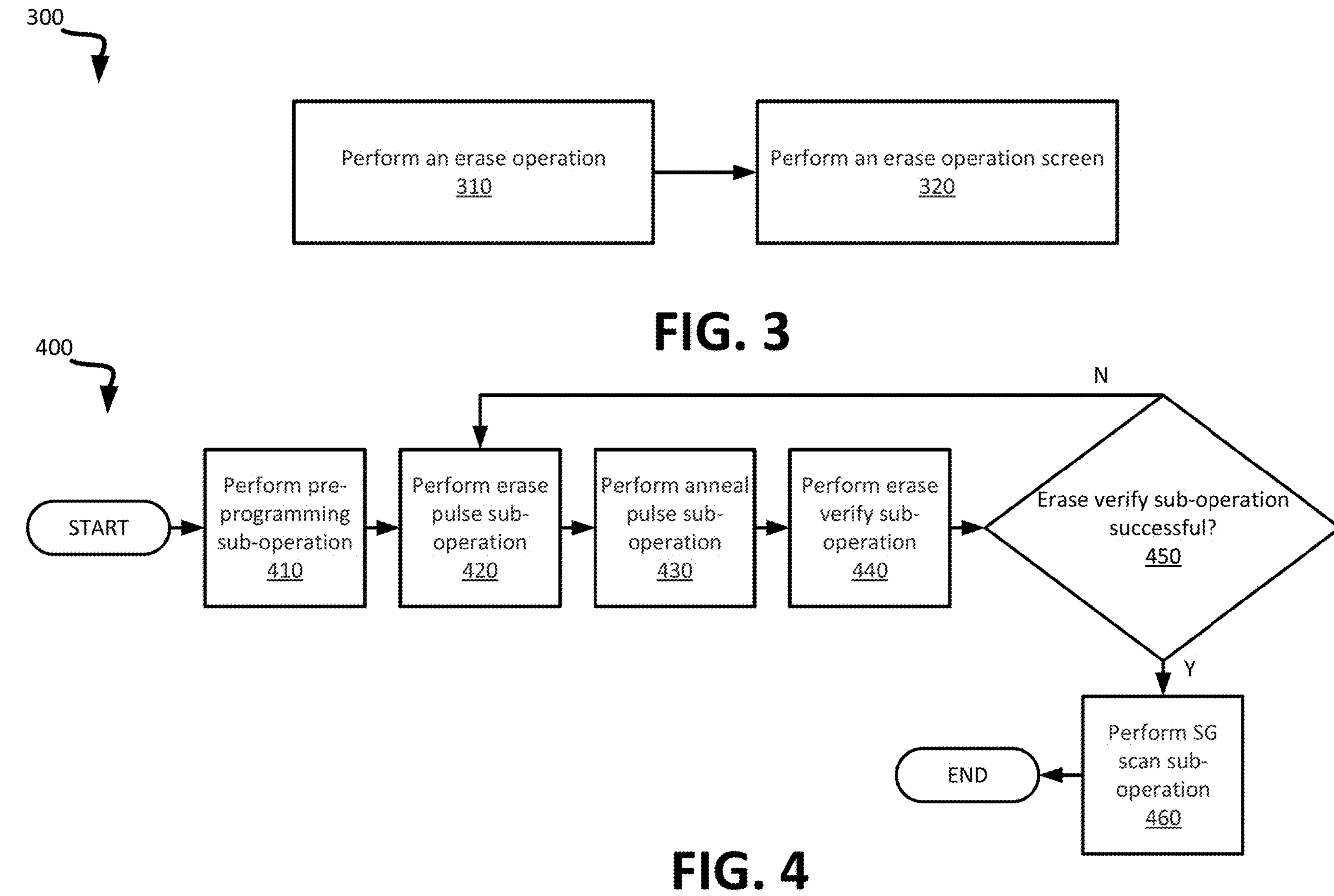
FIG. 3 is a flow diagram of an overview of a method to perform an erase operation and an erase operation screen, in accordance with some embodiments of the present disclosure.
FIG. 4 is a flow diagram of an example method to perform an erase operation implementing defect detection, in accordance with some embodiments of the present disclosure.

FIG. 3 is a flow diagram of an example method 300 to perform an erase operation and an erase operation screen, in accordance with some embodiments of the present disclosure. The method 300 can be performed by control logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the DD component 137 of FIGS. 1 and 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, an erase operation is performed. For example, control logic (e.g., DD component 137 implemented by local media controller 135) causes the erase operation to be performed with respect to a block of a memory device. In some embodiments, the memory device is a 3D replacement gate memory device (e.g., 3D replacement gate NAND). The erase operation can include a number of sub-operations.

As will be described in further detail below with reference to FIG. 4, the erase operation can include a number of sub-operations. Depending on the embodiment, the sub-operations can include a pre-programming sub-operation, an erase pulse sub-operation, an optional anneal pulse sub-operation, an erase verify sub-operation, and a SG scan sub-operation. Each of these sub-operations takes a relatively short time to perform, e.g., 40-60 microsecond (μs), except for the erase pulse sub-operation, which can take up to 1 millisecond (ms) or longer, for example.

As will be described in further detail below with reference to FIG. 4, control logic can cause a defect detection process to be performed during one or more of the sub-operations. In some embodiments, the defect detection process is performed during only one of the sub-operations. In some embodiments, the defect detection process is performed during all of the sub-operations. In some embodiments, the defect detection process is performed during a proper subset of the sub-operations. For example, the defect detection process can be performed during the erase pulse sub-operation and the erase verify sub-operation.

At operation 320, an erase operation screen is performed. For example, control logic causes the erase operation screen to be performed after the erase operation is performed. The erase operation screen is performed to determine whether the block, after the erase operation is performed, is a valid or "good" block to maintain data. If the block is determined to be valid, then the block can continue to be used during operation. If the block is determined to be an invalid or "bad" block to maintain data, then data will not continue to be stored at the block and a new block will be designated for data storage. Any suitable process can be used to perform the erase operation screen in accordance with the embodiments described herein.

FIG. 4 is a flow diagram of an example method 400 to perform an erase operation implementing defect detection, in accordance with some embodiments of the present disclosure, in accordance with some embodiments of the present disclosure. The method 400 can be performed by control logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the DD component 137 of FIGS. 1 and 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, a pre-programming sub-operation is performed. For example, control logic (e.g., DD component 137 implemented by local media controller 135) can cause a pre-programming process to be performed with respect to wordlines (WLs) associated with memory cells ("memory cells") of a memory array (e.g., block) of a memory device. For example, the memory device can be the memory device 130 of FIG. 1.

The pre-programming process can be viewed as a "soft" programming of the memory array. During the pre-programming process, all of the memory cells of the memory array can be programmed together in order to tighten the threshold voltage ($V_t$) distribution after performing the erase operation. For example, select gates (SGs) and active WLs can be biased to respective voltages. An illustrative example of the pre-programming sub-operation being performed with respect to a memory array of a 3D replacement gate memory device is provided below with reference to FIG. 6.

In some embodiments, defect detection can further be performed during the pre-programming sub-operation. For example, control logic can further cause a detection method to be performed with respect to at least one failure point. A failure point can be a result of a defect during processing of the memory array. For example, a failure point can be a result of etch problems (e.g., overetch) during the fabrication of the memory array.

The at least one failure point can include at least one failure point related to a WL short within the memory array. For example, with respect to a memory array of a 3D replacement gate memory device, examples of failure points include, but are not limited to, WL to pillar short, WL to through-array-via (TAV) short, and WL (or SG) to bitline/source line short.

WL to pillar short refers to a short between a WL and a pillar including a pillar located between the bitline and the source line. WL to TAV short refers to a short between a WL and a TAV used to connect the WL to an outside contact. For example, the short can be caused by etching defects between adjacent TAVs. WL (or SG) to bitline/source line short refers to a short between a WL or a SG to the bitline or the source line.

A charge pump circuit is a component of a WL driver circuit that generates voltages for operating the memory device. For example, a charge pump circuit can charge an array of capacitors that operate on different phased blocks to boost an input voltage to a target voltage to be applied to a WL. The WL driver circuit can further include a voltage regulator sensor circuit that monitors the voltage generated by the charge pump circuit. For example, the voltage regulator sensor circuit can stop operation of the charge pump when the charge pump circuit reaches the target voltage to be applied to the WL. More specifically, the voltage regulator sensor circuit can pass or inhibit clock signals to the charge pump circuit using a feedback signal as a control signal. Due to leakage, the output voltage level will slowly drop when the charge pump circuit is not operating. When the output voltage level decreases below a threshold voltage, the voltage regulator sensor circuit can restart the charge pump to raise the output voltage level back to the target voltage. A defect, such as a WL short, can increase the background leakage, which can cause the charge pump circuit to take longer to charge, and can increase the use of the feedback/control signal.

One example of defect detection methods include pump clock counter defect detection. For example, control logic can initiate a pump clock counter (e.g., included in the voltage regulator sensor circuit) to count the number of clock pulses delivered to the charge pump circuit within a given amount of time after the charge pump achieves the target voltage, and compare the count to a threshold count number to detect the existence of a defect. For example, if the count exceeds the threshold count number, this can be indicative of a defect.

Figure 8:
FIG. 8 is a diagram of an comparator circuit that can be used to perform ICS defect detection, in accordance with some embodiments of the present disclosure.
Figure 8:
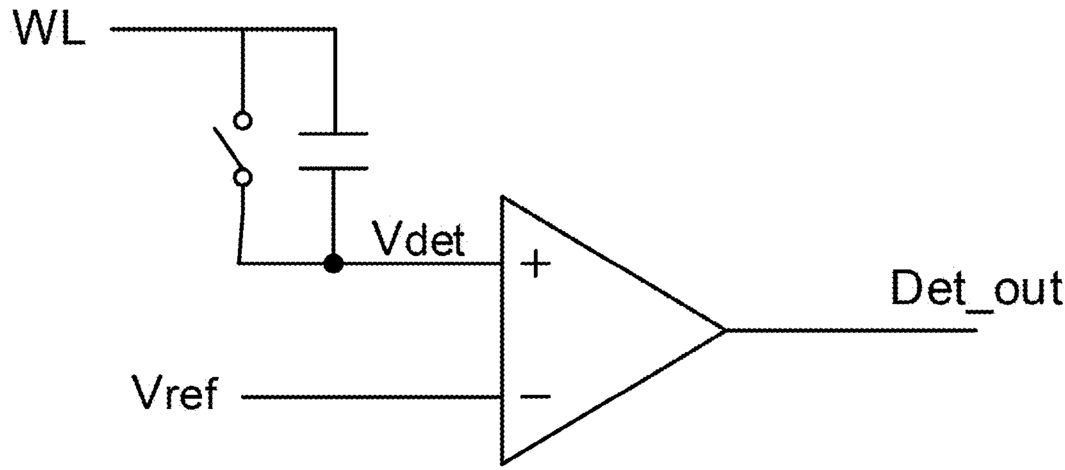

Another example of defect detection is Internal Current Sense (ICS) defect detection. ICS defect detection can employ a comparator circuit including a comparator having the positive terminal attached to a detected voltage ($V_{det}$) and the negative terminal attached to a reference voltage ($V_{ref}$). ICS defect detection can be performed with respect to a target WL by driving the target WL to a particular voltage ($V_{det}$) higher than $V_{ref}$, and floating the target WL to perform the defect detection. If a defect does not exist with respect to the target WL, then $V_{det}$ will remain relatively stable and the detected output signal (Det_out) will continue to indicate that $V_{det}$ is greater than $V_{ref}$. However, if a defect exists with respect to the target WL (e.g., WL to WL short, WL to pillar short), then $V_{det}$ will drop. Eventually, once $V_{det}$ drops below $V_{ref}$, Det_out will flip to indicate that $V_{ref}$ is greater. An example comparator circuit that can be used to perform ICS defect detection is shown with reference to FIG. 8.

At operation 420, an erase pulse sub-operation is performed. For example, control logic causes an erase pulse to be applied. More specifically, the erase pulse sub-operation involves applying an erase pulse to the memory cells of a group of WLs that are undergoing erasure. The erase pulse sub-operation can take a significantly lengthy period of time (or duration) compared to other memory operations and compared to other sub-operations of the erase operation. The duration of the erase pulse sub-operation can be lengthy due to a significant bias voltage (Vera), e.g., of around 20 volts (V), applied to strings of the memory cells being erased with an erase pulse. It can take a significant length of time to ramp up to this bias voltage and a significant amount of time for the strings of memory cells to recover, e.g., discharge, after the erase pulse sub-operation is completed. An erase inhibit bias can be applied to inhibit erase with respect to memory cells that are not undergoing erasure. If any memory cells are determined to not be erased during erase verify (as will be described in further detail below), then another erase pulse sub-operation can be performed with an erase pulse having a higher voltage than the previous erase pulse. This process can continue until the erase has been verified for all of the memory cells of the group of WLs. An illustrative example of the erase pulse sub-operation being performed with respect to a memory array of a 3D replacement gate memory device is provided below with reference to FIG. 6.

In some embodiments, defect detection can further be performed during the erase pulse sub-operation. For example, control logic can further cause a detection method to be performed with respect to at least one failure point. The at least one failure point can include at least one failure point related to a current leak and/or voltage drop resulting from the current leak within the memory array. For example, with respect to a memory array of a 3D replacement gate memory device, examples of failure points include, but are not limited to, source line (SRC) leak, bitline leak, pillar to WL leak, and WL to WL leak. SRC leak refers to a current leak between the SRC and a component attached to the SRC (e.g., circuit), bitline leak refers to a current leak between the bitline and a component attached to the bitline (e.g., circuit), pillar to WL leak refers to a current leak between the pillar and a WL, and WL to WL leak refers to a current leak between pairs of WLs. These leaks can be identified in view of the low voltage bias applied with respect to the active WLs during the erase pulse (e.g., about 0 V). With respect to WL to WL leak, this failure point can be detected in the event that the erase pulse is applied with respect to alternate active WLs (e.g., even or odd WLs). For example, if an even erase pulse is applied, then memory cells corresponding to even active WLs are biased at a low voltage (e.g., 0 V) while memory cells corresponding to odd active WLs are biased at a higher voltage, which can enable detect of a leak between memory cells of adjacent even and odd WLs. Examples of defect detection methods include, but are not limited to, pump clock defect detection (e.g., CPCM), WL voltage regulator sensor defect detection, and ICS defect detection.

At operation 430, an anneal pulse sub-operation can be performed. For example, control logic causes an anneal pulse to be applied to the WLs. The purpose of the anneal pulse is to "flush" out shallow charge carriers (e.g., shallow holes and/or shallow electrons) from the pillar (e.g., oxide area) to increase erase verify accuracy. The anneal pulse can be applied with respect to alternating WLs. More specifically, the anneal pulse can be performed with respect to even WLs using an even anneal pulse, and then by odd WLs using an odd anneal pulse. For example, during an even anneal pulse, memory cells corresponding to the even WLs can be ramped to a positive bias voltage, while the memory cells corresponding to the odd WLs can be ramped to a negative bias voltage (and vice versa with respect to an odd anneal pulse). In some embodiments, defect detection can further be performed during the anneal pulse sub-operation. For example, control logic can further cause a detection method to be implemented to detect a failure. Examples of failures include, but are not limited to, WL to WL leak, WL to pillar leak, and WL to via leak. Examples of detection methods include, but are not limited to, pump clock defect detection (e.g., CPCM), WL regulator short sensor defect detection, and ICS defect detection. Further details regarding the anneal pulse sub-operation are described below with reference to FIG. 6.

At operation 440, an erase verify sub-operation is performed. For example, control logic causes erase verify to be performed to determine whether memory cells have been properly erased due to the erase pulse. Erase verify can be performed by applying a voltage to a control gate of a memory cell to determine whether the memory cell conducts a current. In some embodiments, the erase verify is applied with respect to alternating WLs. For example, erase verify can first be performed with respect to even WLs of a WL group, then with respect to odd WLs of the WL group.

In some embodiments, defect detection can further be performed during the erase verify sub-operation. For example, control logic can further cause a detection method to be implemented to detect a failure. Examples of failures include, but are not limited to, WL to WL leak, WL to pillar leak, and WL to via leak. Examples of defect detection methods include, but are not limited to, pump clock defect detection (e.g., CPCM), WL regulator short sensor defect detection, and ICS defect detection.

At operation 450, it is determined whether erase verify sub-operation was successful. For example, the erase verify sub-operation is determined to be successful if all of memory cells pass erase verify. If not, the process reverts back to operation 420 to perform another erase pulse sub-operation at a higher erase pulse voltage than used during the previous performance of the erase pulse sub-operation.

If the erase verify sub-operation is determined to be successful at operation 450, this means that all of the memory cells have been successfully erased. At operation 460, a select gate (SG) scan sub-operation can then be performed. For example, control logic causes an SG scan to be performed with respect to an SG. The SG scan is performed after the erase operation has been completed to determine whether the VI of the SG falls outside of an acceptable range (e.g., is too high or too low). If the SG falls outside of the acceptable range, then the memory array (e.g., block) can be tagged as an invalid or bad memory array, and the memory array will not be used for further programming. Otherwise, the memory array will be deemed a valid or good memory array for future programming.

In some embodiments, defect detection can further be performed during the SG scan sub-operation. For example, control logic can further cause a detection method to be implemented to detect a failure. Examples of failures include, but are not limited to, SG to WL leak, SG to bitline and/or SRC leak, and SG to pillar leak. Examples of defect detection methods include, but are not limited to, pump clock defect detection (e.g., CPCM), WL regulator short sensor defect detection, and ICS defect detection.

Figure 5A:
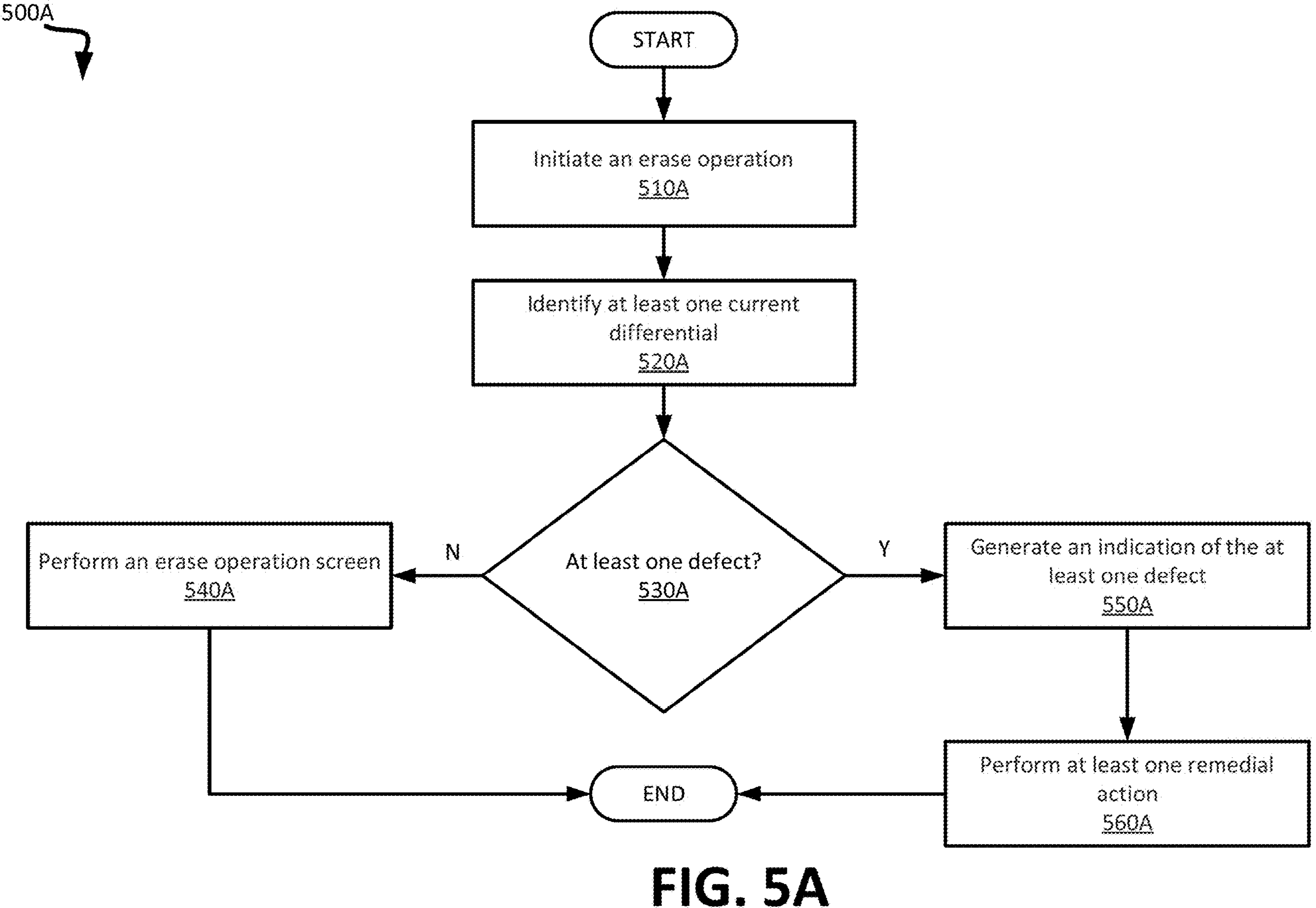

FIG. 5A is a flow diagram of an example method 500A to perform defect detection during at least one sub-operation of an erase operation, in accordance with some embodiments of the present disclosure. The method 500A can be performed by control logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500A is performed by the DD component 137 of FIGS. 1 and 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510A, an erase operation is initiated. For example, control logic (e.g., DD component 137 implemented by local media controller 135) can cause the erase operation to be initiated in response to receiving a request to initiate the erase operation from a memory sub-system controller. The erase operation can be performed with respect to wordlines (WLs) associated with memory cells ("cells") of a memory array (e.g., block) of a memory device.

At operation 520A, at least one current differential is identified. For example, control logic can cause the at least one current differential to be identified between a pair of components of the memory device during at least one sub-operation of the erase operation. The at least one current differential can correspond to a current leak between the pair of components. The at least one sub-operation can include at least one of a pre-programming sub-operation, an erase pulse sub-operation, an anncal pulse sub-operation, an erase verify sub-operation, or a select gate scan sub-operation. The at least one current differential can be identified as a difference between a first voltage applied to a first component of the pair of components during the at least one sub-operation, and a second voltage applied to a second component of the pair of components during the at least one sub-operation. The pair of components can include at least one of a WL, a pillar, a TAV, a bitline, a source line, or a SG.

At operation 530A, it is determined whether at least one defect exists. For example, control logic can determine whether the at least one current differential is indicative of at least one defect with respect to at least one corresponding failure point of the memory device. In some embodiments, determining whether the at least one defect exists includes determining whether the at least one current differential exceeds a corresponding threshold current differential. The threshold current differential can define a value or range of values that are indicative of proper connections between the pair of components. The at least one failure point can include at least one of: a WL to WL leak, a WL to pillar leak or short, a WL to TAV leak or short, a source line leak, a bitline leak, a pillar to WL and SG leak, or a WL to bitline or source line short. Any suitable method can be used to identify the at least one current differential and determine whether the at least one defect exists. Examples of defect detection methods include WL pump clock defect detection, WL regular short sensor defect detection, and ICS defect detection.

If a defect is not determined to exist at operation 530A, then an erase operation screen can be performed at operation 540A. For example, control logic can cause the erase operation screen to be performed.

However, if at least one defect is determined to exist at operation 530A, an indication of the at least one defect can be generated at operation 550A. For example, control logic can cause the indication of the at least one defect to be generated and sent to the memory sub-system controller. At operation 560A, control logic can perform at least one remedial action. For example, control logic can receive a request from the memory sub-system controller to perform the at least one remedial action. For example, the at least one remedial action can include at least one of: marking the memory device as a defective memory device (e.g., a memory device including one or more current leaks between one or more pairs of components), or discarding (e.g., retiring) the defective memory device. Further details regarding operations 510A-560A are described above with reference to FIGS. 1-4.

FIG. 5B is a flow diagram of an example method 500B to perform defect detection during at least one sub-operation of an erase operation, in accordance with some embodiments of the present disclosure. The method 500B can be performed by control logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500B is performed by the memory sub-system controller 115 of FIGS. 1 and 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510B, an erase operation is initiated. For example, control logic (e.g., control logic of the memory sub-system controller 115) can cause the erase operation to be initiated by sending a request to initiate the erase operation to a memory device. More specifically, the memory device can include a memory array (e.g., block) and a local media controller (e.g., array of memory cells 204 and local media controller 135). The erase operation can include a plurality of sub-operations performed with respect to the memory array.

At operation 520B, an indication of at least one defect is received. For example, control logic can receive, from the memory device, an indication of at least one defect with respect to at least one corresponding failure point of the memory array (e.g., via the local media controller). The at least one defect can correspond to at least one current differential identified between a pair of components of the memory device during at least one sub-operation of the erase operation. The at least one current differential can correspond to a current leak between the pair of components. The at least one sub-operation can include at least one of a pre-programming sub-operation, an erase pulse sub-operation, an anneal pulse sub-operation, an erase verify sub-operation, or a select gate scan sub-operation. The at least one current differential can be identified as a difference between a first voltage applied to a first component of the pair of components during the at least one sub-operation, and a second voltage applied to a second component of the pair of components during the at least one sub-operation. The pair of components can include at least one of a WL, a pillar, a TAV, a bitline, a source line, or a SG.

In some embodiments, the at least one current differential exceeds a corresponding threshold current differential. The threshold current differential can define a value or range of values that are indicative of proper connections between the pair of components. The at least one failure point can include at least one of: a WL to WL leak, a WL to pillar leak or short, a WL to TAV leak or short, a source line leak, a bitline leak, a pillar to WL and SG leak, or a WL to bitline or source line short. Any suitable method can be used to identify the at least one current differential and determine whether the at least one defect exists. Examples of defect detection methods include WL pump clock defect detection, WL regular short sensor defect detection, and ICS defect detection.

At operation 530B, control logic can perform at least one remedial action. For example, control logic can send a request to the memory device (e.g., via the local media controller) to perform the at least one remedial action. For example, the at least one remedial action can include at least one of: marking the memory device as a defective memory device (e.g., a memory device including one or more current leaks between one or more pairs of components), or discarding (e.g., retiring) the defective memory device. Accordingly, methods 500A-500B can be used to identify a defective memory device during an erase operation, and perform at least one remedial action to address the defective memory device. Further details regarding operations 510B-530B are described above with reference to FIGS. 1-5A.

Figure 6:
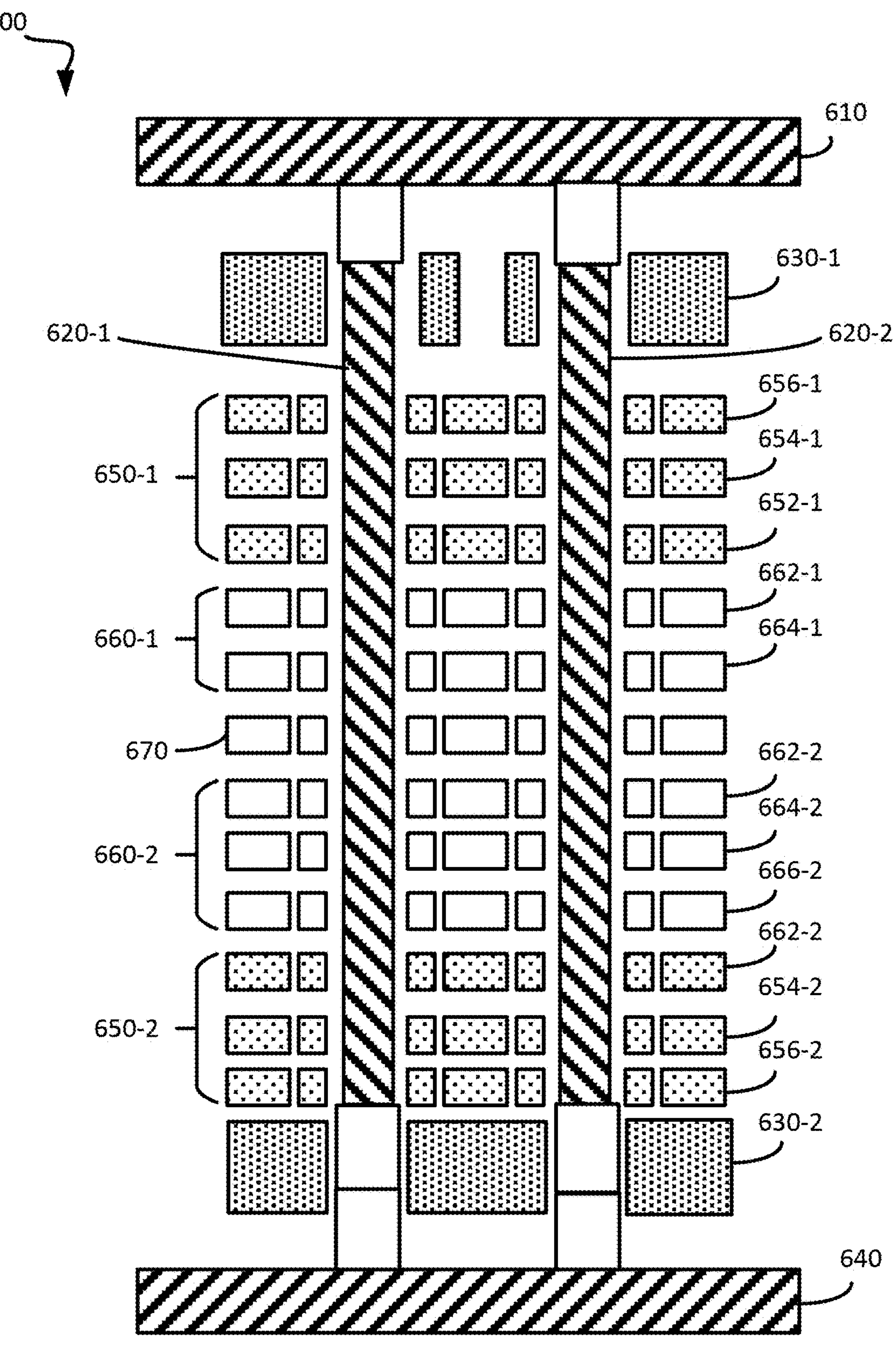
FIG. 6 is a diagram of an example three-dimensional (3D) replacement gate memory device to illustrate the performance of an erase operation, in accordance with some embodiments of the present disclosure.

FIG. 6 is a diagram of an example three-dimensional (3D) replacement gate memory device ("device") 600 to illustrate the performance of an erase operation, in accordance with some embodiments of the present disclosure. However, the embodiments described herein can be applied to any suitable memory device.

As shown, the device 600 includes a bitline 610, pillars 620-1 and 620-2, select gates (SGs) 630-1 and 630-2, a source line (SRC) 640, and WL groups 650-1, 650-2, 660-1 and 660-2. More specifically, WL groups 650-1 and 650-2 are dummy WL groups, and WL groups 660-1 and 660-2 are active WL groups. WL group 650-1 includes dummy WLs 652-1 through 666-1, WL group 650-2 includes dummy WLs 652-2 through 656-2, WL group 660-1 includes active WLs 662-1 and 664-1, and WL group 660-2 includes active WLs 662-2, 664-2 and 666-2. However, such an example should not be considered limiting. A dummy WL corresponds to memory cells that do not store data and are included to satisfy processing margins, while an active WL corresponds to memory cells that store data.

As further shown, a WL 670 is provided. In some embodiments, the device 600 is a multiple deck device, in which WL groups 650-1 and 660-1 are associated with a first deck (e.g., an upper deck) of the device 600 and the WL groups 650-2 and 660-2 are associated with a second deck (e.g., a lower deck) of the device 600, such that the WL 670 corresponds to a dummy WL separating the WL groups 660-1 and 660-2. In other embodiments, the device 600 is a "single deck" device, in which the WL groups 660-1 and 660-2 are not arranged in decks. Here, the WL 670 can be an active WL within one of the WL groups 660-1 or 660-2.

Illustratively, during the pre-programming sub-operation (e.g., the pre-programming sub-operation performed at operation 410 of FIG. 4), the bitline 610, the pillars 620-1 and 620-2, and the SRC 640 can each be at a low bias voltage (e.g., 0 V). The SGs 630-1 and 630-2 and the memory cells corresponding to the WL groups 650-1, 650-2, 660-1 and 660-2 can be ramped to a higher bias voltage. For example, the SGs 630-1 and 630-2 can be ramped to a bias voltage of about 6 V), the memory cells corresponding to the dummy WLs 652-1 and 652-2 can be ramped to a bias voltage of about 9 V, the memory cells corresponding to the dummy WLs 654-1 and 654-2 can be ramped to a bias voltage of about 6 V, and the memory cells corresponding to the WL groups 660-1 and 660-2 can be ramped to a bias voltage of about 12 V. However, such example bias voltages should not be considered limiting. Defect detection can be performed during the pre-programming sub-operation, as described above with reference to FIG. 4.

Illustratively, during the erase pulse sub-operation (e.g., the erase pulse sub-operation performed at operation 420 of FIG. 4), the bitline 610, the pillars 620-1 and 620-2 and the SRC 640 can each be ramped to a bias voltage of about 24 V, the SGs 630-1 and 630-2 can each be ramped to a bias voltage of about 20 V, the memory cells corresponding to the dummy WLs 652-1 and 652-2 can be ramped to a bias voltage of about 8 V, the memory cells corresponding to the dummy WLs 654-1 and 654-2 can be ramped to a bias voltage of about 12 V, and the memory cells corresponding to the dummy WLs 656-1 and 656-2 can be ramped to a voltage of about 16 V.

If the erase pulse is applied with respect to each of the WLs of the WL groups 660-1 and 660-2, then memory cells corresponding to the WL groups 660-1 and 660-2 can be at a low bias voltage (e.g., 0 V). However, in some instances, the erase pulse can be applied with respect to alternate WLs. For example, the erase pulse can be applied with respect to even WLs or odd WLs. If the erase pulse is applied with respect to even WLs, the memory cells corresponding to even WLs within the WL groups 660-1 and 660-2 can be at the low bias voltage (e.g., 0 V), while the memory cells corresponding to odd WLs within the WL groups 660-1 and 660-2 can be ramped to a higher bias voltage (e.g., about 6 V). Alternatively, if the erase pulse is applied with respect to odd WLs, the memory cells corresponding to odd WLs within the WL groups 660-1 and 660-2 can be at the low bias voltage (e.g., 0 V), while the memory cells corresponding to even WLs within the WL groups 660-1 and 660-2 can be ramped to the higher bias voltage (e.g., about 6 V). During the erase inhibit (e.g., the erase inhibit applied during the erase pulse sub-operation at operation 420 of FIG. 4), the pillars 620-1 and 620-2, the bitline 610 and SRC 640, the SGs 630-1 and 630-2, and the memory cells correspond to each of the WL groups 650-1, 650-2, 660-1 and 660-2 can all be at a voltage of about 24 V. However, such example bias voltages should not be considered limiting. Defect detection can be performed during the erase pulse sub-operation, as described above with reference to FIG. 4.

Illustratively, during the anneal pulse sub-operation (e.g., the anneal pulse sub-operation performed at operation 430 of FIG. 4), the bitline, the pillars 620-1 and 620-2 can be and the SRC 640 can each be at a low bias voltage (e.g., 0 V), the SGs 630-1 and 630-2 can be ramped to a bias voltage of about 6 V, the memory cells corresponding to the dummy wordlines 652-1 and 652-2 can be ramped to a bias voltage of about 9 V, and the memory cells corresponding to the dummy wordlines 654-1 and 654-2 can be ramped to a bias voltage of about 6 V. The anneal pulse can be applied with respect to alternate WLs. For example, the anneal pulse can be applied with respect to even WLs or odd WLs. If the anneal pulse is applied with respect to even WLs, the memory cells corresponding to even WLs of the WL groups 660-1 and 660-2 can be ramped to a bias voltage of about 8 V, while the memory cells corresponding to odd WLs of the WL groups 660-1 and 660-2 can be ramped to a negative bias voltage (e.g., about-2 V). Alternatively, if the anneal pulse is applied with respect to odd WLs, the memory cells corresponding to odd WLs of the WL groups 660-1 and 660-2 can be ramped to a bias voltage of about 8 V, while the memory cells corresponding to even WLs of the WL groups 660-1 and 660-2 can be ramped to a negative bias voltage (e.g., about-2 V). However, such example bias voltages should not be considered limiting. Defect detection can be performed during the anneal pulse sub-operation, as described above with reference to FIG. 4.

Illustratively, during the erase verify sub-operation (e.g., the erase verify sub-operation performed at operation 440 of FIG. 4), the pillars 620-1 and 620-2 can be at a low bias voltage (e.g., 0 V), the bitline 610 can be ramped to a bias voltage of about 1 V, the SRC 640 can be ramped to a bias voltage between 0 V and about 0.5 V, the SGs 630-1 and 630-2 can be ramped to a bias voltage of about 6 V, the memory cells corresponding to the dummy wordlines 652-1 and 652-2 can be ramped to a bias voltage of about 9 V, and the memory cells corresponding to the dummy wordlines 654-1 and 654-2 can be ramped to a bias voltage of about 6 V. The erase verify can be performed with respect to alternate WLs. For example, the erase verify can be performed with respect to even WLs or odd WLs. If the erase verify is applied with respect to even WLs, the memory cells corresponding to even WLs the WL groups 660-1 and 660-2 can be ramped to a voltage of about 8 V, while the memory cells corresponding to odd WLs of the WL groups 660-1 and 660-2 can be ramped to a bias voltage of about-2 V. Alternatively, if the erase verify is performed with respect to odd WLs, the memory cells corresponding to the even WLs of the WL groups 660-1 and 660-2 can be ramped to a bias voltage of about-2 V, while the memory cells corresponding to the odd WLs of the WL groups 660-1 and 660-2 can be ramped to a bias voltage of about 8 V. However, such example bias voltages should not be considered limiting. Defect detection can be performed during the erase verify sub-operation, as described above with reference to FIG. 4.

Illustratively, during the SG scan sub-operation (e.g., the erase verify sub-operation performed at operation 440 of FIG. 4), the pillar 620-1 can be ramped to a low bias voltage (e.g., 0 V), the pillar 620-2 can be ramped to a bias voltage of about 2.3 V, the bitline 610 can be ramped to a bias voltage between about 0 V and about 2.3 V, the SRC 640 can be ramped to a bias voltage of about 2.3 V, the SG 630-1 can be ramped to a bias voltage of about 6 V, the SG 630-2 can be ramped to a low bias voltage (e.g., 0 V), the memory cells corresponding to the dummy wordlines 652-1 and 652-2 can be ramped to a bias voltage of about 9 V, the memory cells corresponding to the dummy wordlines 654-1 and 654-2 can be ramped to a bias voltage of about 6 V, and the memory cells corresponding to the WL groups 660-1 and 660-2 can be ramped to a bias voltage of about 8 V. However, such example bias voltages should not be considered limiting. Defect detection can be performed during the SG scan sub-operation, as described above with reference to FIG. 4.

Figure 7:
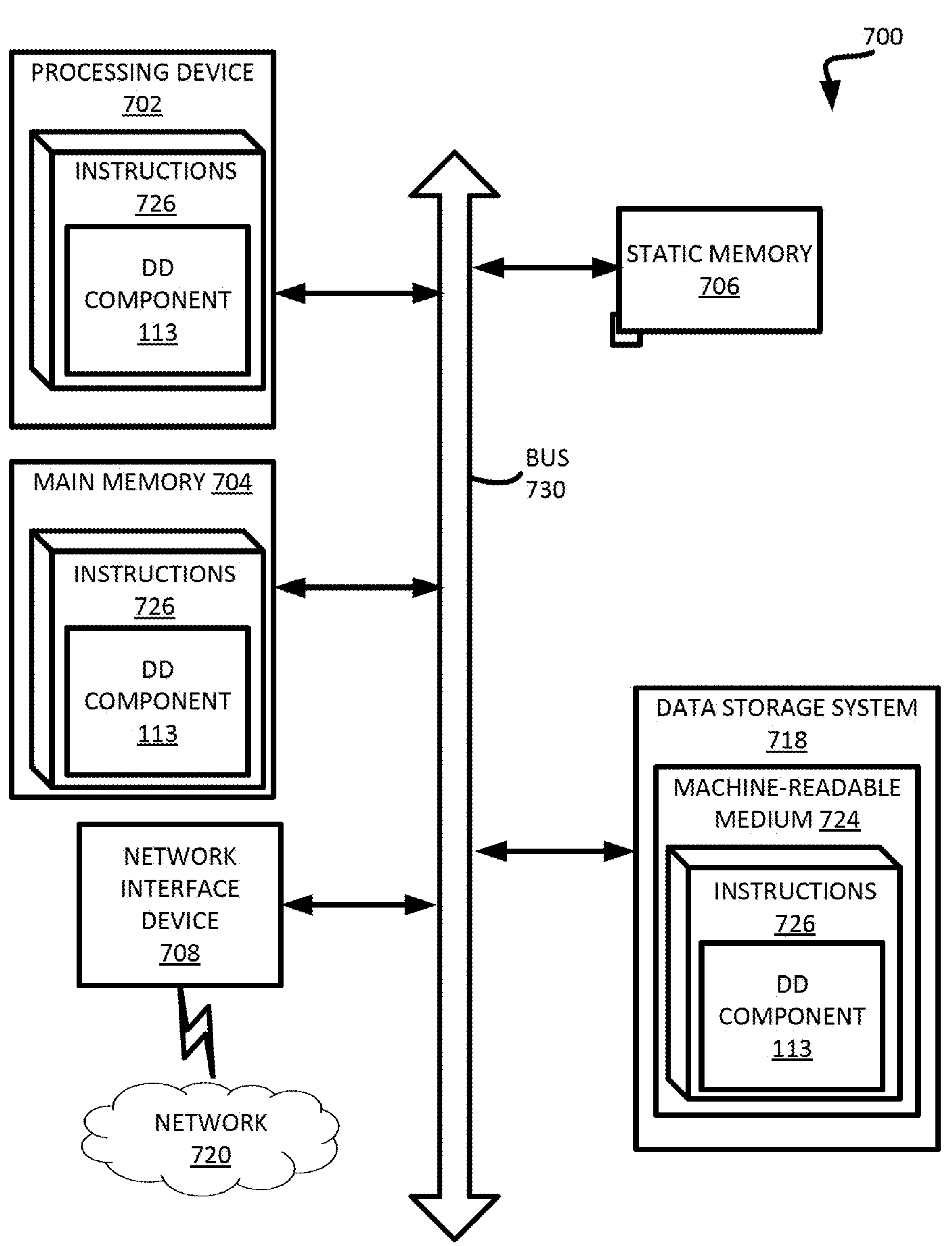
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the DD component 137 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a memory cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or RDRAM, etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a DD component (e.g., the DD component 137 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:

a memory array; and processing logic, operatively coupled with the memory array, to perform operations comprising:

initiating an erase operation performed with respect to the memory array, wherein the erase operation comprises a select gate scan sub-operation;

identifying, between a pair of components of the memory array, at least one current differential indicative of at least one defect with respect to at least one failure point of the memory array; and causing an indication of the at least one defect to be generated.

2. The memory device of claim 1, wherein the erase operation further comprises an erase pulse sub-operation and an erase verify sub-operation.

3. The memory device of claim 2, wherein the erase operation further comprises a pre-programming sub-operation performed prior to the erase pulse sub-operation.

4. The memory device of claim 2, wherein the erase operation further comprises an anneal pulse sub-operation performed between the erase pulse sub-operation and the erase verify sub-operation.

5. The memory device of claim 2, wherein the operations further comprise:

determining that the erase verify sub-operation is successful; and in response to determining that the erase verify sub-operation is successful, causing the select gate scan sub-operation to be performed.

6. The memory device of claim 1, wherein:

the at least one current differential is identified as a difference between a first voltage applied to a first component of the pair of components, and a second voltage applied to a second component of the pair of components; and determining whether the at least one current differential is indicative of at least one defect with respect to the at least one failure point of the memory array comprises determining whether the at least one current differential exceeds a corresponding threshold current differential.

7. The memory device of claim 6, wherein:

the pair of components comprises at least one of: a wordline (WL), a pillar, a through-array-via, a bitline, a source line, or a select gate; and the at least one failure point comprises at least one of: a WL to WL leak, a WL to pillar leak or short, a WL to TAV leak or short, a source line leak, a bitline leak, a pillar to WL and select gate (SG) leak, or a WL to bitline or source line short.

8. The memory device of claim 1, wherein the operations further comprise causing at least one remedial action to be performed, the at least one remedial action comprising at least one of: marking the memory device as a defective memory device, or discarding the defective memory device.

9. A method comprising:

initiating, by a processing device, an erase operation performed with respect to a memory array of a memory device, wherein the erase operation comprises a select gate scan sub-operation;

identifying, by the processing device and between a pair of components of the memory array, at least one current differential indicative of at least one defect with respect to at least one failure point of the memory array; and causing, by the processing device, an indication of the at least one defect to be generated.

10. The method of claim 9, wherein the erase operation further comprises an erase pulse sub-operation and an erase verify sub-operation.

11. The method of claim 10, wherein the erase operation further comprises a pre-programming sub-operation performed prior to the erase pulse sub-operation.

12. The method of claim 10, wherein the erase operation further comprises an anneal pulse sub-operation performed between the erase pulse sub-operation and the erase verify sub-operation.

13. The method of claim 10, further comprising:

determining, by the processing device, that the erase verify sub-operation is successful; and in response to determining that the erase verify sub-operation is successful, causing, by the processing device, the select gate scan sub-operation to be performed.

14. The method of claim 9, wherein:

the at least one current differential is identified as a difference between a first voltage applied to a first component of the pair of components, and a second voltage applied to a second component of the pair of components; and determining whether the at least one current differential is indicative of at least one defect with respect to the at least one failure point of the memory array comprises determining whether the at least one current differential exceeds a corresponding threshold current differential.

15. The method of claim 9, wherein:

the pair of components comprises at least one of: a wordline (WL), a pillar, a through-array-via, a bitline, a source line, or a select gate; and the at least one failure point comprises at least one of: a WL to WL leak, a WL to pillar leak or short, a WL to TAV leak or short, a source line leak, a bitline leak, a pillar to WL and select gate (SG) leak, or a WL to bitline or source line short.

16. The method of claim 9, further comprising causing, by the processing device, at least one remedial action to be performed, the at least one remedial action comprising at least one of: marking the memory device as a defective memory device, or discarding the defective memory device.

17. A system comprising:

a memory comprising instructions; and processing logic, operatively coupled with the memory, to perform operations comprising:

sending, to a memory device, a request to initiate an erase operation performed with respect to a memory array of the memory device, wherein the erase operation comprises a select gate scan sub-operation;

receiving, from the memory device, an indication of at least one defect with respect to at least one failure point of the memory array, wherein the at least one defect corresponds at least one current differential identified between a pair of components of the memory array; and in response to receiving the indication of the at least one defect, sending, to the memory device, a request to perform at least one remedial action.

18. The system of claim 17, wherein:

the at least one current differential is identified as a difference between a first voltage applied to a first component of the pair of components, and a second voltage applied to a second component of the pair of components; and the at least one current differential exceeds a corresponding threshold current differential.

19. The system of claim 17, wherein:

the pair of components comprises at least one of: a wordline (WL), a pillar, a through-array-via, a bitline, a source line, or a select gate; and the at least one failure point comprises at least one of: a WL to WL leak, a WL to pillar leak or short, a WL to TAV leak or short, a source line leak, a bitline leak, a pillar to WL and select gate (SG) leak, or a WL to bitline or source line short.

20. The system of claim 17, wherein the at least one remedial action comprises at least one of: marking the memory device as a defective memory device, or discarding the defective memory device.

* * * * *